US011472821B2

(12) United States Patent
Hwang et al.

(10) Patent No.: US 11,472,821 B2
(45) Date of Patent: Oct. 18, 2022

(54) PRECURSOR COMPOUNDS FOR ATOMIC LAYER DEPOSITION (ALD) AND CHEMICAL VAPOR DEPOSITION (CVD) AND ALD/CVD PROCESS USING THE SAME

(71) Applicant: HANSOL CHEMICAL CO., LTD., Seoul (KR)

(72) Inventors: Jung-Wun Hwang, Jeollabuk-do (KR); Ki-Yeung Mun, Jeollabuk-do (KR); Jun-Won Lee, Jeollabuk-do (KR); Kyu-Hyun Yeom, Jeollabuk-do (KR); Jang-Hyeon Seok, Sejong-si (KR); Jung-Woo Park, Seoul (KR)

(73) Assignee: HANSOL CHEMICAL. CO., LTD., Seoul (KR)

( * ) Notice: Subject to any disclaimer, the term of this patent is extended or adjusted under 35 U.S.C. 154(b) by 6 days.

(21) Appl. No.: 17/047,918

(22) PCT Filed: Oct. 25, 2018

(86) PCT No.: PCT/KR2018/012722
§ 371 (c)(1),
(2) Date: Oct. 15, 2020

(87) PCT Pub. No.: WO2019/203407
PCT Pub. Date: Oct. 24, 2019

(65) Prior Publication Data
US 2021/0230193 A1 Jul. 29, 2021

(30) Foreign Application Priority Data
Apr. 18, 2018 (KR) .................. 10-2018-0044802

(51) Int. Cl.
*C23C 16/18* (2006.01)
*C23C 16/40* (2006.01)
(Continued)

(52) U.S. Cl.
CPC ............... *C07F 5/062* (2013.01); *C07F 3/06* (2013.01); *C23C 16/18* (2013.01); *C23C 16/45527* (2013.01)

(58) Field of Classification Search
CPC ... C23C 16/18; C23C 16/20; C23C 16/45527; C23C 16/40; C07F 5/062; C07F 3/06
See application file for complete search history.

(56) References Cited

U.S. PATENT DOCUMENTS 5,209,952 A * 5/1993 Erdmann ............... C23C 16/301
427/255.6
9,528,182 B2 12/2016 Bluhm et al.
2013/0122192 A1 5/2013 Bluhm et al.

FOREIGN PATENT DOCUMENTS

KR 20120072986 A 7/2012
KR 20160082350 A 7/2016
(Continued)

OTHER PUBLICATIONS

Machine translation KR2016/0082350 (Year: 2016).*
(Continued)

*Primary Examiner* — Elizabeth A Burkhart
(74) *Attorney, Agent, or Firm* — Venable LLP

(57) ABSTRACT

The present invention relates to precursor compounds, and more particularly to nonpyrophoric precursor compounds suitable for use in thin film deposition through atomic layer deposition (ALD) or chemical vapor deposition (CVD), and to an ALD/CVD process using the same.

7 Claims, 10 Drawing Sheets

(51) Int. Cl.
*C23C 16/455* (2006.01)
*C07F 5/06* (2006.01)
*C07F 3/06* (2006.01)

(56) References Cited

FOREIGN PATENT DOCUMENTS

| KR | 20160101697 A | 8/2016 |
| KR | 20170055268 A | 5/2017 |
| KR | 20170059742 A | 5/2017 |
| WO | 2010151430 A1 | 12/2010 |

OTHER PUBLICATIONS

Kim, M., et al., "Effects of Ligand and Cosolvent on Oxidative Coupling Polymerization of 2,6-Dimethylphenol Catalyzed by Chelaing Amine-Copper(II) Complexes", Macromolecular Research, vol. 21, No. 10, pp. 1054-1058 (2013).

Schumann, H., et al., "Intramolecularly stabilized organoaluminium and organogallium compounds: synthesis and X-ray crystal structures of some dimethylaluminium and -gallium alkoxides Me2M-O-R-OR'" and amides Me2M-NH-R-OR', Journal of Organometallic Chemistry 512 pp. 117-126 (1996).

Rothgery Eugene et al: "Borverbindungen, XXVI, Wirkungsweise des Diäthylboryl-pivalats bei der N-Diäthyl-borylierung von Alkylaminen und von Ammoniak," Justus Liebigs Annalen Der Chemie, vol. 1974, No. 1, Feb. 15, 1974 (Feb. 15, 1974), pp. 101-111, XP055795015, DE ISSN: 0075-4617, DOI: 10.1002/jlac.197419740110.

* cited by examiner

PRECURSOR COMPOUNDS FOR ATOMIC LAYER DEPOSITION (ALD) AND CHEMICAL VAPOR DEPOSITION (CVD) AND ALD/CVD PROCESS USING THE SAME

The present application is a national-stage entry under 35 U.S.C. § 371 of International Patent Application No. PCT/KR2018/012722, published as WO 2019/203407A1, filed Oct. 25, 2018, which claims priority to Korean Patent Application No. 10-2018-0044802, filed Apr. 18, 2018, the entire disclosure of each of which is incorporated by reference herein.

BACKGROUND OF THE INVENTION

1. Technical Field

The present invention relates to novel precursor compounds, and more particularly to nonpyrophoric precursor compounds, which enables the deposition of a thin film through atomic layer deposition (ALD) and chemical vapor deposition (CVD), and to an ALD/CVD process using the same.

2. Description of the Related Art

A technique for manufacturing an $Al_2O_3$ thin film using an ALD/CVD process is regarded as important from the viewpoints of solving problems with organic electronic devices, such as preventing corrosion of metal materials due to humidity and creating a moisture barrier, and may also be applied to intermediate insulators and to solar cell passivation.

The formation of an $Al_2O_3$ thin film requires a deposition process at a low deposition temperature, specifically, a temperature lower than room temperature, and TMA [Al$(CH_3)_3$] is mainly utilized as a precursor for manufacturing an $Al_2O_3$ thin film using an existing ALD/CVD process. Here, TMA has an ideal ALD thin film deposition rate, but is pyrophoric, which is undesirable. Thus, research is ongoing into safe precursors for the manufacture of large volumes on an industrial scale.

As for studies with regard to a nonpyrophoric precursor compound including aluminum (Al) as a trivalent transition metal of Group 13, a method of preparing [Al$(CH_3)_2$(µ-O$^i$Pr)]2 (DMAI, $^i$Pr=isopropyl) is disclosed in the literature [Plasma-enhanced and thermal atomic layer deposition of $Al_2O_3$ using dimethylaluminum isopropoxide, [Al$(CH_3)_2$(µ-O$^i$Pr)]$_2$, as an alternative aluminum precursor (I Vac. Sci. Technol. A, 2012, 30(2), 021505-1)], but is problematic because the density of the $Al_2O_3$ thin film is low after the ALD process.

Accordingly, there is a need to develop a precursor, which is structurally stable and thus makes it possible to form a thin film in a wide temperature range (ALD window) during ALD/CVD, by newly designing the structure of a precursor compound, which is nonpyrophoric and has thermal stability that prevents decomposition after vaporization, and high reactivity with a variety of oxidizing, nitriding or reducing agents.

CITATION LIST

Patent Literature

Korean Patent No. 10-1787204 (Registration Date: Oct. 11, 2017)

SUMMARY OF THE INVENTION

Therefore, the present invention is intended to provide a novel precursor compound suitable for use in an atomic layer deposition (ALD) process and a chemical vapor deposition (CVD) process, and a method of manufacturing a thin film through deposition of the precursor compound.

According to the present invention, the novel precursor compound is a heteroleptic precursor compound composed of transition metals of Groups 12 and 13. Since an existing homoleptic precursor compound is pyrophoric, the precursor compound of the present invention may be used in place thereof, and has thermal stability that prevents decomposition upon vaporization and high reactivity with various oxidizing agents.

Also, the precursor compound of the present invention is capable of providing aluminum oxide ($Al_2O_3$) through an atomic layer deposition (ALD) process and a chemical vapor deposition (CVD) process using ozone ($O_3$) or water ($H_2O$), has a wide processing temperature range (ALD window), enables realization of a stoichiometric metal oxide thin film having high purity, and may exhibit superior step coverage.

However, the problems to be solved by the present invention are not limited to the foregoing, and other problems not mentioned will be clearly understood by those skilled in the art from the following description.

An aspect of the present invention provides a compound represented by Chemical Formula 1 below.

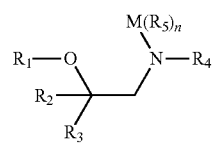

[Chemical Formula 1]

In Chemical Formula 1, when M is a divalent transition metal of Group 12 on the periodic table, n is 1; when M is a trivalent transition metal of Group 13 on the periodic table, n is 2; and $R_1$ to $R_5$ are hydrogen, a substituted or unsubstituted C1 to C4 linear or branched alkyl group or an isomer thereof.

Another aspect of the present invention provides a precursor including the compound represented by Chemical Formula 1.

Still another aspect of the present invention provides a thin film formed through deposition of the precursor including the compound represented by Chemical Formula 1.

Yet another aspect of the present invention provides a method of manufacturing a thin film, including introducing the precursor including the compound represented by Chemical Formula 1 into a reactor.

According to the present invention, a novel heteroleptic precursor compound, composed of a transition metal of Group 12 (Zn: zinc) or Group 13 (Al: aluminum; Ga: gallium; In: indium) and an alkyl group(s) and an alkoxy amide group, can be prepared. The Al precursor compound has a thin film deposition rate comparable to existing TMA (trimethylaluminum), can be used as an alternative to TMA (trimethylaluminum), which is pyrophoric under atmospheric conditions, and has a wide processing temperature range (ALD window).

Also, the precursor compound has thermal stability that prevents decomposition upon vaporization, high reactivity with a variety of oxidizing agents, and a wide processing temperature range (ALD window). Moreover, a stoichiometric metal oxide thin film having high purity can be obtained, and superior step coverage can be exhibited.

DESCRIPTION OF SPECIFIC EMBODIMENTS

Figure 1:
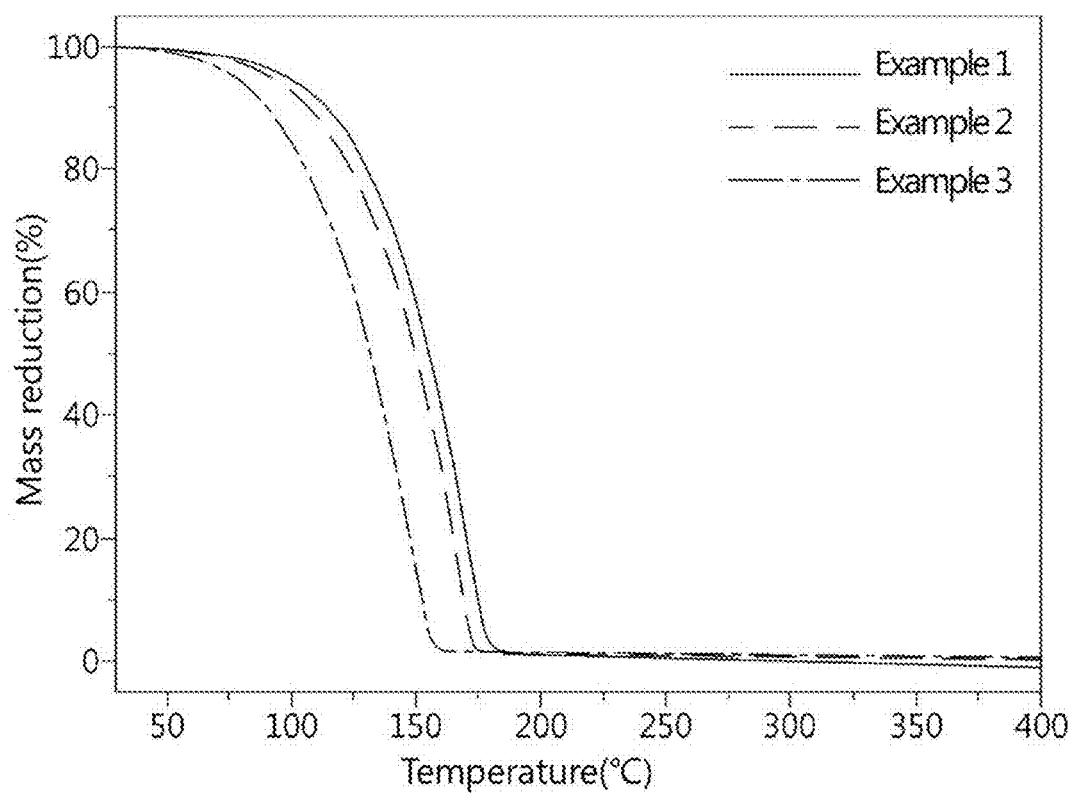
FIG. 1 is a graph showing the results of thermogravimetric analysis (TGA) of the properties of novel precursor compounds according to the present invention.

Hereinafter, a detailed description will be given of embodiments of the present invention, which may be easily performed by those skilled in the art to which the present invention belongs. However, the present invention may be embodied in a variety of different forms, and is not limited to the embodiments herein.

An aspect of the present invention pertains to a compound represented by Chemical Formula 1 below.

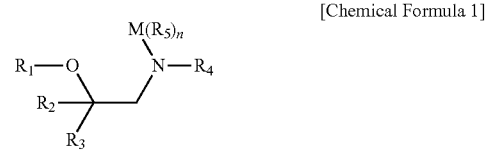

[Chemical Formula 1]

In Chemical Formula 1, when M is a divalent transition metal of Group 12 on the periodic table, n is 1; when M is a trivalent transition metal of Group 13 on the periodic table, n is 2; and $R_1$ to $R_5$ are hydrogen, a substituted or unsubstituted C1 to C4 linear or branched alkyl group, or an isomer thereof.

In an embodiment of the present invention, M in Chemical Formula 1 may include, but is not limited to, any one selected from the group consisting of Al, Zn, In and Ga.

In an embodiment of the present invention, $R_1$ to $R_5$ in Chemical Formula 1 may include, but are not limited to, any one selected from the group consisting of hydrogen, a methyl group, an ethyl group, an n-propyl group, an iso-propyl group, an n-butyl group, an iso-butyl group, a sec-butyl group, a tert-butyl group and isomers thereof.

In the above compound, M and $R_1$ to $R_5$ may be at least one selected from the group consisting of combinations of the above-listed examples, but are not limited thereto.

In an embodiment of the present invention, the precursor compound of Chemical Formula 1 may be a solid or a liquid at room temperature, and also has high volatility and thermal stability, high reactivity with various oxidizing agents, and a wide processing temperature range (ALD window) in an ALD process.

In an embodiment of the present invention, the compound of Chemical Formula 1 may be used as an alternative to an existing commercially available pyrophoric compound. The existing commercially available compound is composed exclusively of a transition metal and a homoleptic alkyl group, and specific examples thereof may include $AlMe_3$, $AlEt_3$, $ZnMe_2$, $ZnEt_2$, $GaMe_3$, $GaEt_3$, $InMe_3$, and $InEt_3$ (Me: methyl, Et: ethyl).

The thin film deposition process includes an atomic layer deposition (ALD) process and a chemical vapor deposition (CVD) process.

The atomic layer deposition process is a technique for forming a thin film through a self-limiting reaction by alternately feeding elements for use in forming a thin film. The atomic layer deposition process is able to deposit a very thin film and to precisely control the desired thickness and composition. This process enables the formation of a film having a uniform thickness on a large-area substrate, and exhibits superior step coverage even at a high aspect ratio. Furthermore, the thin film contains small amounts of impurities.

The chemical vapor deposition process is a technique for forming a desired thin film on the surface of a substrate by applying appropriate activity and reactive energy through injection of reactive gas into a reactor. This process enables mass production, is cost-effective, makes it possible to deposit various kinds of elements and compounds, and makes it easy to obtain a thin film having various properties by virtue of wide processing control ranges, and moreover realizes superior step coverage.

In an embodiment of the present invention, a precursor composition for use in the atomic layer deposition (ALD) and the chemical vapor deposition (CVD) includes a compound represented by Chemical Formula 1 below.

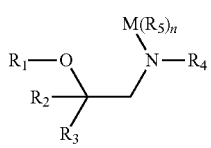

[Chemical Formula 1]

In an embodiment of the present invention, M in Chemical Formula 1 may be a transition metal of Groups 12 and 13 on the periodic table, and preferably M is any one selected from the group consisting of Al, Zn, In and Ga, but is not limited thereto.

In an embodiment of the present invention, $R_1$ to $R_5$ in Chemical Formula 1 may be any one selected from the group consisting of hydrogen, a methyl group, an ethyl group, an n-propyl group, an iso-propyl group, an n-butyl group, an iso-butyl group, a sec-butyl group, a tert-butyl group and isomers thereof. Preferable is a compound in which $R_1$ is a methyl group, $R_2$ and $R_3$ are hydrogen or a methyl group, $R_4$ is a tert-butyl group, and $R_5$ is a methyl group or an ethyl group. More preferable is any one selected from the group consisting of $Al(CH_3)_2[CH_3OC(CH_3)_2CH_2NtBu]$, $Al(CH_3)_2[CH_3OCH(CH_3)CH_2NtBu]$, $Al(CH_3)_2[CH_3OCH_2CH_2NtBu]$, $Zn(CH_3)[CH_3OCH_2CH_2NtBu]$, $Zn(CH_3)[CH_3OC(CH_3)_2CH_2NtBu]$, $Zn(Et)[CH_3OC(CH_3)_2CH_2NtBu]$, $In(CH_3)_2[CH_3OCH_2CH_2NtBu]$, and $Ga(CH_3)_2[CH_3OCH_2CH_2NtBu]$ (Et: ethyl, tBu: tert-butyl), but the present invention is not limited thereto.

Another aspect of the present invention pertains to a precursor including the compound represented by Chemical Formula 1.

Still another aspect of the present invention pertains to a thin film formed by depositing the precursor including the compound represented by Chemical Formula 1.

Yet another aspect of the present invention pertains to a method of manufacturing a thin film, including introducing a precursor including the compound represented by Chemical Formula 1 into a reactor. Also, the method of manufacturing a thin film according to the present invention provides a method of manufacturing an oxide film, a nitride film, or a metal film using an oxidizing agent, a nitriding agent or a reducing agent.

In an embodiment of the present invention, the ALD processing temperature falls in the range of 80° C. to 400° C., but is not limited thereto, and the preferable processing temperature falls in the range of 130° C. to 320° C.

In an embodiment of the present invention, the injection time of the precursor compound may fall in the range of 0.2 sec to 10 sec, but is not limited thereto, and the preferable injection time is 2 to 10 sec in an O3 process and 1 to 5 sec in a $H_2O$ process.

In an embodiment of the present invention, the oxidizing agent is ozone ($O_3$) or water ($H_2O$), but is not limited thereto.

A better understanding of the present invention will be given through the following examples, which are merely set forth to illustrate the present invention but are not to be construed as limiting the present invention.

A typical synthesis process of the present embodiment is represented in Scheme 1 below.

[Scheme 1]

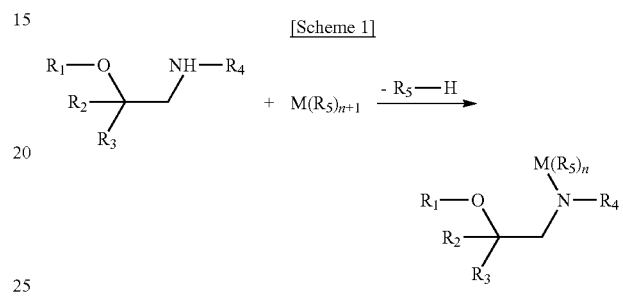

Here, the synthesis process when M (transition metal) is Al (aluminum) is represented in Scheme 2 below.

[Scheme 2]

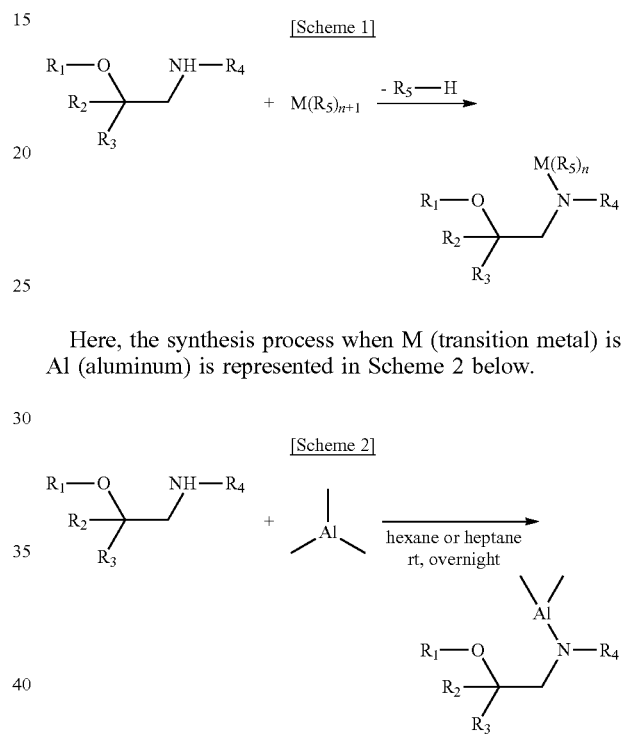

[Example 1] Preparation of $Al(CH_3)_2[CH_3OC(CH_3)_2CH_2NtBu]$ 1 equivalent of a ligand $CH_3OC(CH_3)_2CH_2NHtBu$ was added to 1 equivalent of 2M $Al(Me)_3$, dissolved in hexane or heptane at −78° C., after which the temperature was slowly elevated to room temperature and stirring was performed for about 16 hr. The reaction was completed and the solvent was removed in a vacuum. The compound thus obtained was subjected to vacuum distillation, thereby yielding a colorless liquid precursor $Al(CH_3)_2[CH_3OC(CH_3)_2CH_2NtBu]$. $^1H$ NMR ($C_6D_6$): δ 2.75 ($Al(CH_3)_2[CH_3OC(CH_3)_2CH_2NtBu]$, s, 2H), 2.63 ($Al(CH_3)_2[CH_3OC(CH_3)_2CH_2NtBu]$, s, 3H), 1.28 $Al(CH_3)_2[CH_3OC(CH_3)_2CH_2NtBu]$, s, 9H), 0.83 ($Al(CH_3)_2[CH_3OC(CH_3)_2CH_2NtBu]$, s, 6H), −0.43 ($Al(CH_3)_2[CH_3OC(CH_3)_2CH_2NtBu]$, s, 6H).

[Example 2] Preparation of $Al(CH_3)_2[CH_3OCH(CH_3)CH_2NtBu]$ 1 equivalent of a ligand $CH_3OCH(CH_3)CH_2NHtBu$ was added to 1 equivalent of 2M $Al(Me)_3$, dissolved in hexane or heptane at −78° C., after which the temperature was slowly elevated to room temperature and stirring was performed for about 16 hr. The reaction was completed and the solvent was removed in a vacuum. The compound thus obtained was subjected to vacuum distillation, thereby yielding a colorless liquid precursor Al(CH$_3$)$_2$[CH$_3$OCH(CH$_3$)CH$_2$NtBu]. $^1$H NMR (C$_6$D$_6$): δ 3.40-3.32 (Al(CH$_3$)$_2$[CH$_3$OCH(CH$_3$)CH$_2$NtBu], m, 1H), 2.88 (Al(CH$_3$)$_2$[CH$_3$OCH(CH$_3$)CH$_2$NtBu], dd, J$_1$=11.1 Hz, J$_2$=4.7 Hz, 1H), 2.69-2.65 (Al(CH$_3$)$_2$[CH$_3$OCH(CH$_3$)CH$_2$NtBu], m, 1H), 2.66 (Al(CH$_3$)$_2$[CH$_3$OCH(CH$_3$)CH$_2$NtBu], s, 3H), 1.29 (Al(CH$_3$)$_2$[CH$_3$OCH(CH$_3$)CH$_2$NtBu], s, 9H), 0.68 (Al(CH$_3$)$_2$[CH$_3$OCH(CH$_3$)CH$_2$NtBu], d, J=5.8 Hz, 3H), −0.40 (Al(CH$_3$)$_2$[CH$_3$OCH(CH$_3$)CH$_2$NtBu], s, 3H), −0.44 (Al(CH$_3$)$_2$[CH$_3$OCH(CH$_3$)CH$_2$NtBu], s, 3H).

[Example 3] Preparation of Al(CH$_3$)$_2$[CH$_3$OCH$_2$CH$_2$NtBu]

1 equivalent of a ligand CH$_3$OCH$_2$CH$_2$NHtBu was added to 1 equivalent of 2M Al(Me)$_3$ dissolved in hexane or heptane at −78° C., after which the temperature was slowly elevated to room temperature and stirring was performed for about 16 hr. The reaction was completed and the solvent was removed in a vacuum. The compound thus obtained was subjected to vacuum distillation, thereby yielding a colorless liquid precursor Al(CH$_3$)$_2$[CH$_3$OCH$_2$CH$_2$NtBu]. $^1$H NMR (C$_6$D$_6$): δ 3.09 (Al(CH$_3$)$_2$[CH$_3$OCH$_2$CH$_2$NtBu], t, J=6.9 Hz, 2H), 2.79 (Al(CH$_3$)$_2$[CH$_3$OCH$_2$CH$_2$NtBu], t, J=6.9 Hz, 2H), 2.62 (Al(CH$_3$)$_2$[CH$_3$OCH$_2$CH$_2$NtBu], s, 3H), 1.28 (Al(CH$_3$)$_2$[CH$_3$OCH$_2$CH$_2$NtBu], s, 9H), −0.44 (Al(CH$_3$)$_2$[CH$_3$OCH$_2$CH$_2$NtBu], s, 6H).

Here, the synthesis process when M (transition metal) is Zn (zinc) is represented in Scheme 3 below.

[Scheme 3]

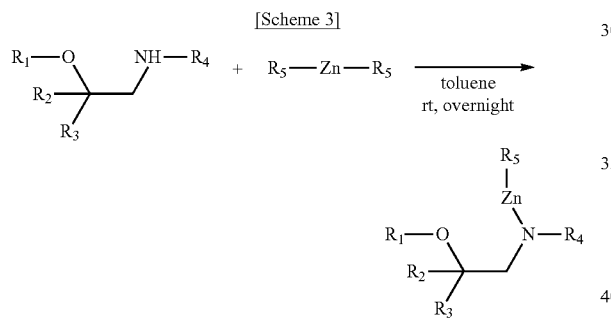

[Example 4] Preparation of Zn(CH$_3$)[CH$_3$OCH$_2$CH$_2$NtBu]

1 equivalent of a ligand CH$_3$OCH$_2$CH$_2$NHtBu was added to 1 equivalent of 1.2M Zn(Me)$_2$ dissolved in toluene at −78° C., after which the temperature was slowly elevated to room temperature and stirring was performed for about 16 hr. The reaction was completed and the solvent was removed in a vacuum. The compound thus obtained was subjected to vacuum distillation, thereby yielding a white solid precursor Zn(CH$_3$)[CH$_3$OCH$_2$CH$_2$NtBu]. $^1$H NMR (C$_6$D$_6$): δ 3.01-2.96 (Zn(CH$_3$)[CH$_3$OCH$_2$CH$_2$NtBu], m, 2H), 2.99 (Zn(CH$_3$)[CH$_3$OCH$_2$CH$_2$NtBu], s, 3H), 2.33-2.29 (Zn(CH$_3$)[CH$_3$OCH$_2$CH$_2$NtBu], m, 2H), 0.91 (Zn(CH$_3$)[CH$_3$OCH$_2$CH$_2$NtBu], s, 9H), −0.39 (Zn(CH$_3$)[CH$_3$OCH$_2$CH$_2$NtBu], s, 3H)

Here, the synthesis process when M (transition metal) is In (indium) is represented in Scheme 4 below.

[Scheme 4]

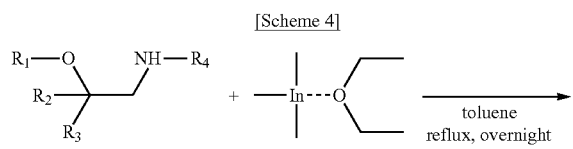

-continued

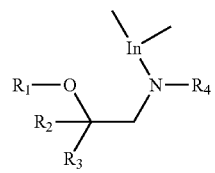

[Example 5] Preparation of In(CH$_3$)$_2$[CH$_3$OCH$_2$CH$_2$NtBu]

1 equivalent of a ligand CH$_3$OCH$_2$CH$_2$NHtBu was added to 1 equivalent of In(Me)$_3$.EtO$_2$ dissolved in toluene at −78° C., after which the temperature was slowly elevated to room temperature and heating to 110° C. was performed for about 16 hr. The reaction was completed and the solvent was removed in a vacuum. The compound thus obtained was subjected to vacuum distillation, thereby yielding a colorless liquid precursor In(CH$_3$)$_2$[CH$_3$OCH$_2$CH$_2$NtBu]. $^1$H NMR (C$_6$D$_6$): δ 3.21 (In(CH$_3$)$_2$[CH$_3$OCH$_2$CH$_2$NtBu], t, J=5.5 Hz, 2H), 2.99 (In(CH$_3$)$_2$[CH$_3$OCH$_2$CH$_2$NtBu], s, 3H), 2.48-2.43 (In(CH$_3$)$_2$[CH$_3$OCH$_2$CH$_2$NtBu], m, 2H), 0.85 (In(CH$_3$)$_2$[CH$_3$OCH$_2$CH$_2$NtBu], s, 9H), 0.00 (In(CH$_3$)$_2$[CH$_3$OCH$_2$CH$_2$NtBu], s, 6H).

Here, the synthesis process when M (transition metal) is Ga (gallium) is represented in Scheme 5 below.

[Scheme 5]

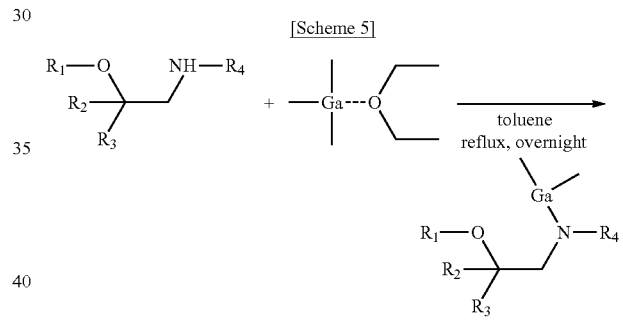

[Example 6] Preparation of Ga(CH$_3$)$_2$[CH$_3$OCH$_2$CH$_2$NtBu]

1 equivalent of a ligand CH$_3$OCH$_2$CH$_2$NHtBu was added to 1 equivalent of Ga(Me)$_3$.EtO$_2$ dissolved in toluene at −78° C., after which the temperature was slowly elevated to room temperature and heating to 110° C. was performed for about 16 hr. The reaction was completed and the solvent was removed in a vacuum. The compound thus obtained was subjected to vacuum distillation, thereby yielding a colorless liquid precursor Ga(CH$_3$)$_2$[CH$_3$OCH$_2$CH$_2$NtBu]. $^1$H NMR (C$_6$D$_6$): δ 3.21 (Ga(CH$_3$)$_2$[CH$_3$OCH$_2$CH$_2$NtBu], t, J=5.2 Hz, 2H), 3.00 (Ga(CH$_3$)$_2$[CH$_3$OCH$_2$CH$_2$NtBu], s, 3H), 2.55-2.51 (Ga(CH$_3$)$_2$[CH$_{30}$ CH$_2$CH$_2$NtBu], m, 2H), 0.92 (Ga(CH$_3$)$_2$[CH$_3$OCH$_2$CH$_2$NtBu], s, 9H), 0.00 (Ga(CH$_3$)$_2$[CH$_3$OCH$_2$CH$_2$NtBu], s, 6H).

Also, Zn(CH$_3$)[CH$_3$OC(CH$_3$)$_2$CH$_2$NtBu] in [Example 7] and Zn(Et)[CH$_3$OC(CH$_3$)$_2$CH$_2$NtBu] in [Example 8] were synthesized using the reaction of Scheme 3.

The structural formulas of the synthesized precursors of Examples and Comparative Example are shown in Table 1 below.

TABLE 1

| | Precursor | Structural Formula |
|---|---|---|
| Example 1 | Al(CH$_3$)$_2$[CH$_3$OC(CH$_3$)$_2$CH$_2$NtBu]<br>(tBu: tert-Bu) | |
| Example 2 | Al(CH$_3$)$_2$[CH$_2$OCH(CH$_3$)CH$_2$NtBu] | |
| Example 3 | Al(CH$_3$)$_2$[CH$_3$OCH$_2$CH$_2$NtBu] | |
| Example 4 | Zn(CH$_3$)[CH$_3$OCH$_2$CH$_2$NtBu] | |
| Example 5 | In(CH$_3$)$_2$[CH$_3$OCH$_2$CH$_2$NtBu] | |
| Example 6 | Ga(CH$_3$)$_2$[CH$_3$OCH$_2$CH$_2$NtBu] | |
| Example 7 | Zn(CH$_3$)[CH$_3$OC(CH$_3$)$_2$CH$_2$NtBu] | |
| Example 8 | Zn(Et)[CH$_3$OC(CH$_3$)$_2$CH$_2$NtBu]<br>(Et: ethyl) | |
| Comparative Example 1 | TMA [trimethylaluminum] | |

[Test Example 1] Measurement of Properties of Precursor Compounds

The properties of $Al(CH_3)_2$ $[CH_3OC(CH_3)_2CH_2NtBu]$, $Al(CH_3)_2[CH_3OCH(CH_3)CH_2NtBu]$ and $Al(CH_3)_2$ $[CH_3OCH_2CH_2NtBu]$ precursor compounds of Examples 5 were measured. Here, the properties of interest were the state at room temperature (RT), the boiling point, and pyrophoric ignition.

The measured values of the above properties are shown in Table 2 below.

TABLE 2

| | | Test Example 1 | | |
|---|---|---|---|---|
| | Precursor | State (RT) | Boiling point (based on bath) | Reactivity in atmosphere |
| Example 1 | $Al(CH_3)_2[CH_3OC(CH_3)_2CH_2NtBu]$ | Liquid | 50° C. @0.3 Torr | Nonpyrophoric |
| Example 2 | $Al(CH_3)_2[CH_3OCH(CH_3)CH_2NtBu]$ | Liquid | 50° C. @0.3 Torr | Nonpyrophoric |
| Example 3 | $Al(CH_3)_2[CH_3OCH_2CH_2NtBu]$ | Liquid | 45° C. @0.5 Torr | Nonpyrophoric |
| Example 4 | $Zn(CH_3)[CH_3OCH_2CH_2NtBu]$ | Solid | Sublimation point: 35° C. @0.3 Torr | Nonpyrophoric |
| Example 5 | $In(CH_3)_2[CH_3OCH_2CH_2NtBu]$ | Liquid | 60° C. @0.7 Torr | Nonpyrophoric |
| Example 6 | $Ga(CH_3)_2[CH_3OCH_2CH_2NtBu]$ | Liquid | 60° C. @0.7 Torr | Nonpyrophoric |
| Comparative Example 1 | TMA | Liquid | 125° C. | Pyrophoric |

As is apparent from Table 2, Examples 1 to 6 of the present invention are nonpyrophoric under atmospheric conditions, and are a solid or a liquid at room temperature.

[Test Example 2] Thermogravimetric Analysis (TGA) of Precursor Compounds

The precursor compounds of Example 1 $(Al(CH_3)_2$ $[CH_3OC(CH_3)_2CH_2NtBu])$, Example 2 $(Al(CH_3)_2$ $[CH_3OCH(CH_3)CH_2NtBu])$ and Example 3 $(Al(CH_3)_2$ $[CH_3OCH_2CH_2NtBu])$ were subjected to TGA.

Upon TGA, a TGA/DSC 1 STAR' System available from Mettler Toledo was used as an instrument, and 50 μL of an alumina crucible was used. The amounts of all samples were 10 mg, and measurement was performed in the temperature range of 30° C. to 400° C. The specific conditions and measured values for TGA are shown in Table 3 below and in FIG. 1.

TABLE 3

| | Test Example 2 | | |
|---|---|---|---|
| Precursor | Example 1 | Example 2 | Example 3 |
| $T_{1/2}$ (° C.) | 155 | 150 | 132 |
| Residual amount at 300° C. | 0.1% | 0.6% | 0.8% |

As is apparent from Table 3, the half-weight loss temperature [T½ ('C)] of the precursors of Examples 1 to 3 is 132° C. to 155° C. Also, the residual amount is almost zero at 300° C., and thermal stability is exhibited without decomposition upon vaporization.

[Preparation Example] Evaluation of Film Formation Through Atomic Layer Deposition (ALD) of Precursor Compound The precursor compound of Example 1 $(Al(CH_3)_2$ $[CH_3OC(CH_3)_2CH_2NtBu])$ was evaluated for film formation through atomic layer deposition (ALD). As oxidizing agents, ozone $(O_3)$ and water $(H_2O)$ were used, and argon (Ar) or nitrogen $(N_2)$ inert gas was used for purging. The injection of the precursor, argon, ozone or water and argon was set as one cycle, and deposition was performed on a silicon (Si) wafer.

As the film formation evaluation items of the thin film manufactured in Preparation Example 1, when ozone $(O_3)$ was used as the oxidizing agent during the processing of the precursor compound of Example 1 $(Al(CH_3)_2[CH_3OC$ $(CH_3)_2 CH_2NtBu])$, changes in the thin film deposition rate depending on the injection time of the precursor, changes in the thin film deposition rate depending on the processing temperature, and the amounts of aluminum (Al), oxygen (O), and carbon (C) in the deposited thin film and the O/Al ratio through XPS (X-ray photoelectron spectroscopy) were measured.

As the film formation evaluation items of the thin film manufactured in Preparation Example 2, when water $(H_2O)$ was used as the oxidizing agent during the processing of the precursor compound of Example 1 $(Al(CH_3)_2[CH_3OC$ $(CH_3)_2 CH_2NtBu])$, changes in the thin film deposition rate depending on the injection time of the precursor, changes in the thin film deposition rate depending on the processing temperature, the amounts of aluminum (Al), oxygen (O), and carbon (C) in the deposited thin film and the O/Al ratio through XPS (X-ray photoelectron spectroscopy), changes in the thickness of the thin film depending on the deposition cycles (growth linearity), the density of $Al_2O_3$ depending on the temperature, and step coverage were measured.

[Preparation Example 1] Evaluation of Film Formation Through Atomic Layer Deposition of Precursor of Example 1 Using O3 as Oxidizing Agent <Changes in Thin Film Deposition Rate Depending on Precursor Injection Time (Saturation)>

Upon atomic layer deposition (ALD) of the precursor of Example 1 $(Al(CH_3)_2[CH_3OC(CH_3)_2CH_2NtBu])$ using ozone $(O_3)$, the injection time of the precursor compound, exhibiting a uniform thin film deposition rate, was measured, and thus a self-limiting reaction was confirmed.

Figure 2:
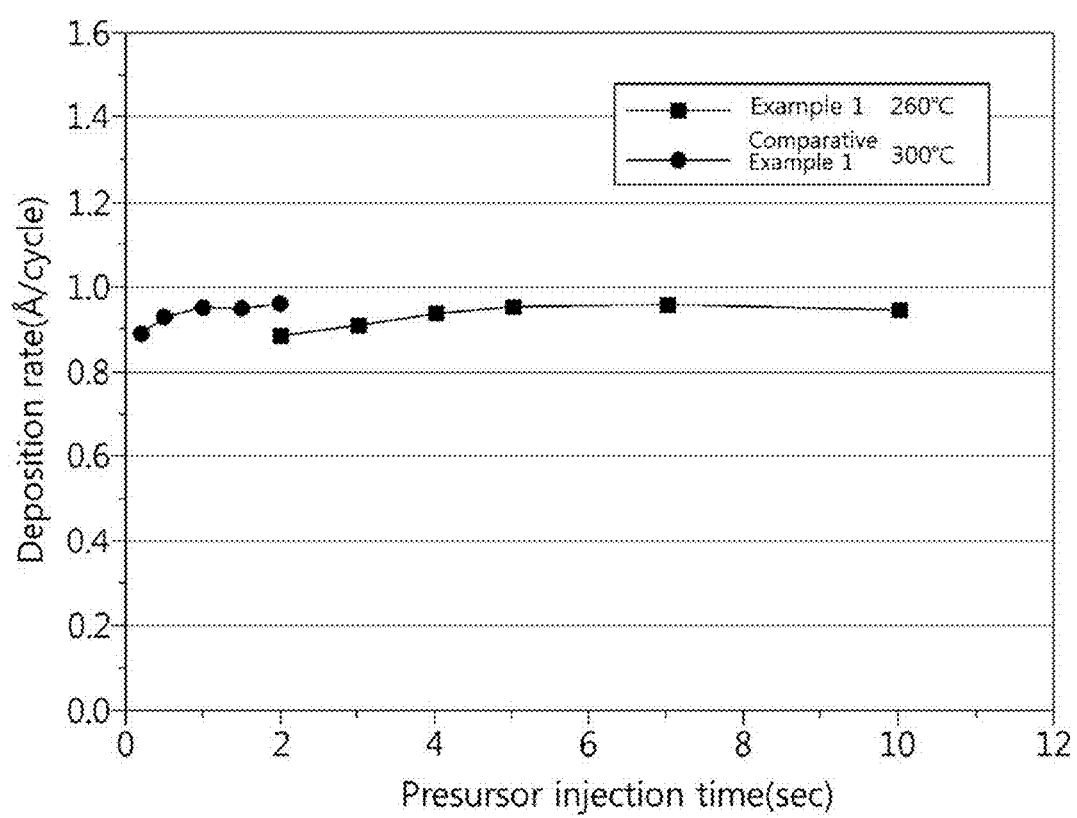
FIG. 2 is a graph showing changes in the thin film deposition rate depending on the precursor injection time in the atomic layer deposition process of the compound of Comparative Example 1 and the compound of Example 1 using ozone ($O_3$) as an oxidizing agent in Preparation Example 1, in which the thin film deposition rate is uniform.

As shown in FIG. 2, the uniform thin film deposition rate was obtained after an injection time of 1 sec when the processing temperature of the precursor of Comparative Example 1 (TMA) was 300° C., and was obtained after an injection time of 4 sec when the processing temperature of the precursor of Example 1 was 260° C.

TABLE 4

| Precursor | Precursor Temp. (° C.) | Carrier gas injection amount (sccm) | $O_3$ Concent. (g/m$^3$) | Processing Temp. (° C.) | Purging gas injection amount (sccm) | Precursor Injection time (sec) | Purging gas injection time (sec) | $O_3$ injection time (sec) | Purging gas injection time (sec) | Processes (cycles) |
|---|---|---|---|---|---|---|---|---|---|---|
| Ex.1 | 40 | 5 | 144 | 260 | 100 | 2~10 | 10 | 3 | 10 | 200 |
| C.Ex.1 | 5 | 10 | 144 | 300 | 500 | 0.2~2 | 10 | 1.2 | 10 | 200 |

As is apparent from Table 4, in Example 1, a precursor (2 to 10 sec), Ar (10 sec), O3 (3 sec), and Ar (10 sec) were sequentially fed, and the flow rate of argon (Ar) for purging the precursor was set to 100 sccm. The reactive gas ozone ($O_3$) was injected at a concentration of 144 g/m$^3$. The temperature of the precursor was 40° C., the flow rate of the carrier gas was 5 sccm, the processing temperature was 260° C., and the number of process cycles was 200.

In Comparative Example 1, a precursor (0.2 to 2 sec), Ar (10 sec), O3 (1.2 sec), and Ar (10 sec) were sequentially fed, and the flow rate of argon (Ar) for purging the precursor was set to 500 sccm. The reactive gas ozone was injected at a concentration of 144 g/m$^3$. The temperature of the precursor of Comparative Example 1 was 5° C., the flow rate of the carrier gas was 10 sccm, the processing temperature was 300° C., and the number of process cycles was 200.

<Changes in Thin Film Deposition Rate Depending on Processing Temperature (ALD Window)>

Figure 3:
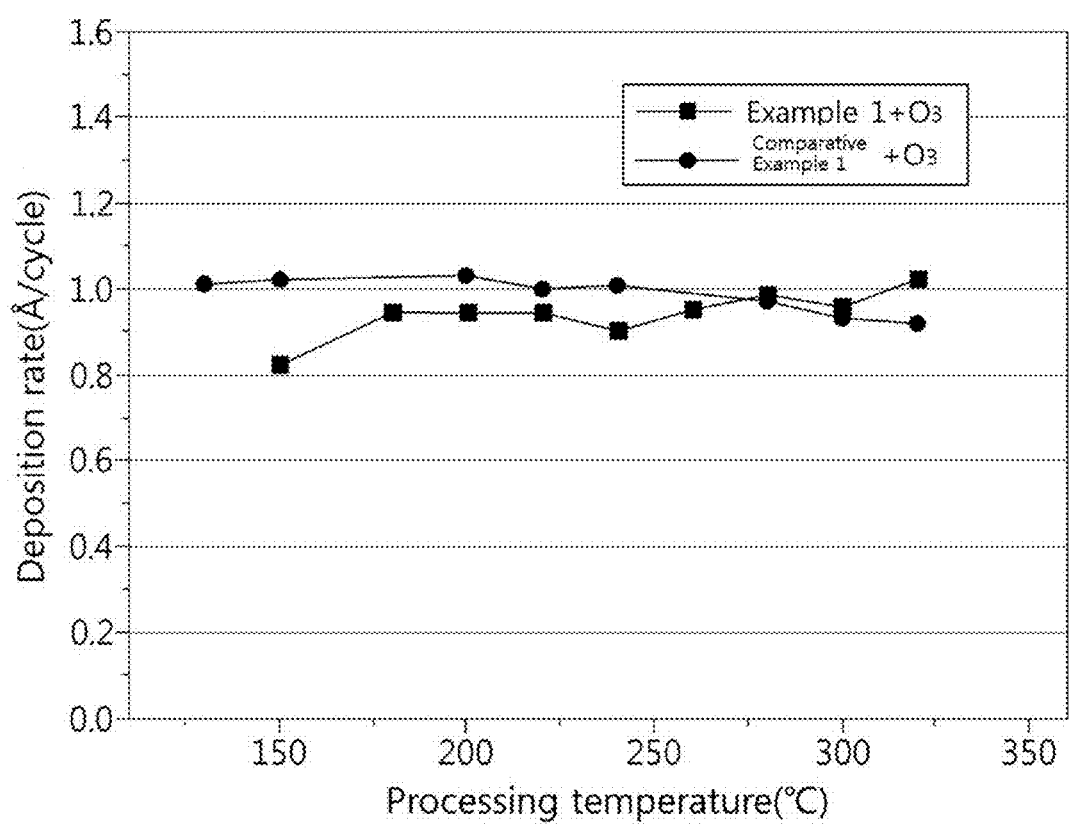
FIG. 3 is a graph showing changes in the thin film deposition rate depending on the processing temperature in the atomic layer deposition process of the compound of Comparative Example 1 and the compound of Example 1 using ozone ($O_3$) as an oxidizing agent in Preparation Example 1, in which a stable thin film deposition rate depending on the temperature and thus a wide processing temperature range (ALD window) are exhibited in Example 1.

Upon atomic layer deposition (ALD) of the precursor of Example 1 (Al(CH$_3$)$_2$[CH$_3$OC(CH$_3$)$_2$CH$_2$NtBu]) using ozone ($O_3$), the thin film deposition rate at different temperatures was measured, and thus the processing temperature range (ALD window) was confirmed. As shown in FIG. 3, the precursor of Example 1 exhibited a uniform thin film deposition rate in a processing temperature range (ALD window) of 150° C. to 320° C.

TABLE 5

| Precursor | Precursor Temp. (° C.) | Carrier gas injection amount (sccm) | $O_3$ Concent. (g/m$^3$) | Processing Temp. (° C.) | Purging gas injection amount (sccm) | Precursor Injection time (sec) | Purging gas injection time (sec) | $O_3$ injection time (sec) | Purging gas injection time (sec) | Processes (Cycles) |
|---|---|---|---|---|---|---|---|---|---|---|
| Ex.1 | 40 | 5 | 144 | 150~320 | 100 | 5 | 10 | 3 | 10 | 200 |
| C.Ex.1 | 5 | 10 | 144 | 130~320 | 500 | 1 | 10 | 1.2 | 10 | 200 |

As is apparent from Table 5, the processing temperature range (ALD window) of the precursor of Example 1 was wide to an extent comparable to that of the commercially available precursor (TMA) of Comparative Example 1.

<Element Content in $Al_2O_3$ Thin Film and O/Al Ratio>

Upon atomic layer deposition (ALD) of the precursor of Example 1 $(Al(CH_3)_2[CH_3OC(CH_3)_2CH_2NtBu])$ using ozone ($O_3$), the element content (atomic %) and the element ratio (atomic ratio, O/Al) depending on the processing temperature were measured through XPS (X-ray photoelectron spectroscopy).

Figure 4:
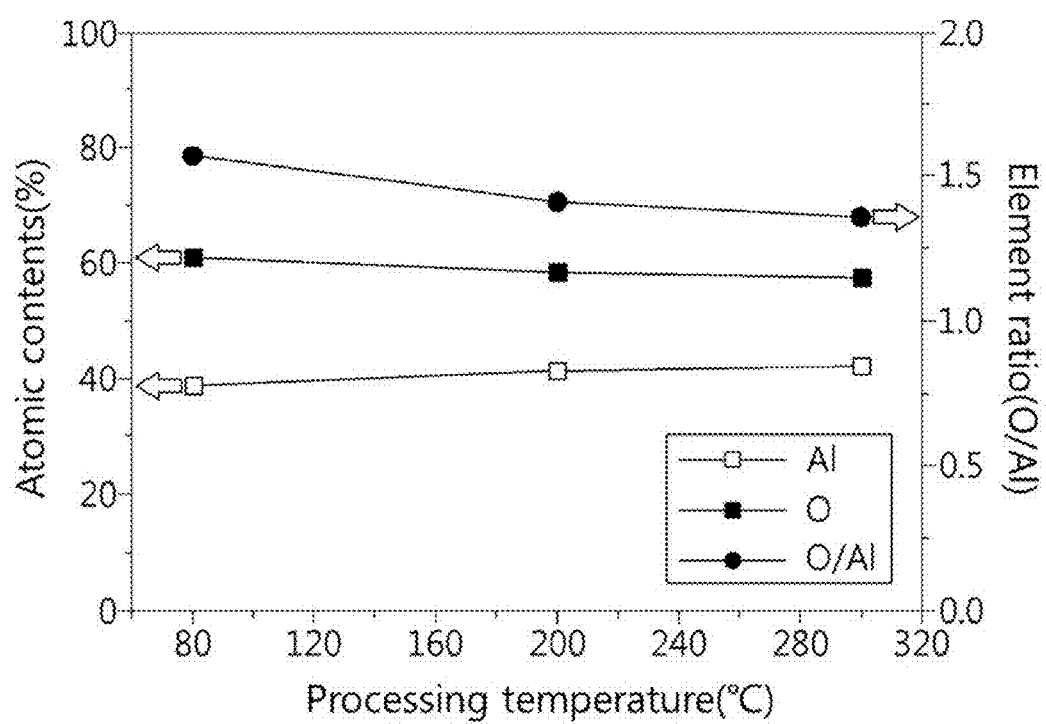
FIG. 4 is a graph showing the results of X-ray photoelectron spectroscopy (XPS) of the component content of the $Al_2O_3$ thin film resulting from atomic layer deposition (ALD) of the compound of Example 1, in the atomic layer deposition process of the compound of Comparative Example 1 and the compound of Example 1 using ozone ($O_3$) as an oxidizing agent in Preparation Example 1.

As seen in FIG. 4, the processing temperature fell in the range of 80° C. to 300° C. and the amount of the stoichiometric $Al_2O_3$ thin film depending on the temperature was determined.

TABLE 6

| Temperature | Preparation Example 1 Example 1 $(Al(CH_3)_2[CH_3OC(CH_3)_2CH_2NtBu] + O_3$ | | | |
|---|---|---|---|---|
| (° C.) | Al (%) | O (%) | C (%) | O/Al Ratio |
| 80 | 38.91 | 61.09 | — | 1.57 |
| 200 | 41.54 | 58.46 | — | 1.41 |
| 300 | 42.33 | 57.67 | — | 1.36 |

As is apparent from Table 6, no carbon (C) was observed, even at a low temperature. As the temperature was elevated, the amount of Al (aluminum) was increased and the amount of O (oxygen) was decreased, and thus the O/Al ratio was reduced.

[Preparation Example 2] Evaluation of Film Formation Through Atomic Layer Deposition of Precursor of Example 1 Using $H_2O$ as Oxidizing Agent <Changes in Thin Film Deposition Rate Depending on Precursor Injection Time (Saturation)>

Figure 5:
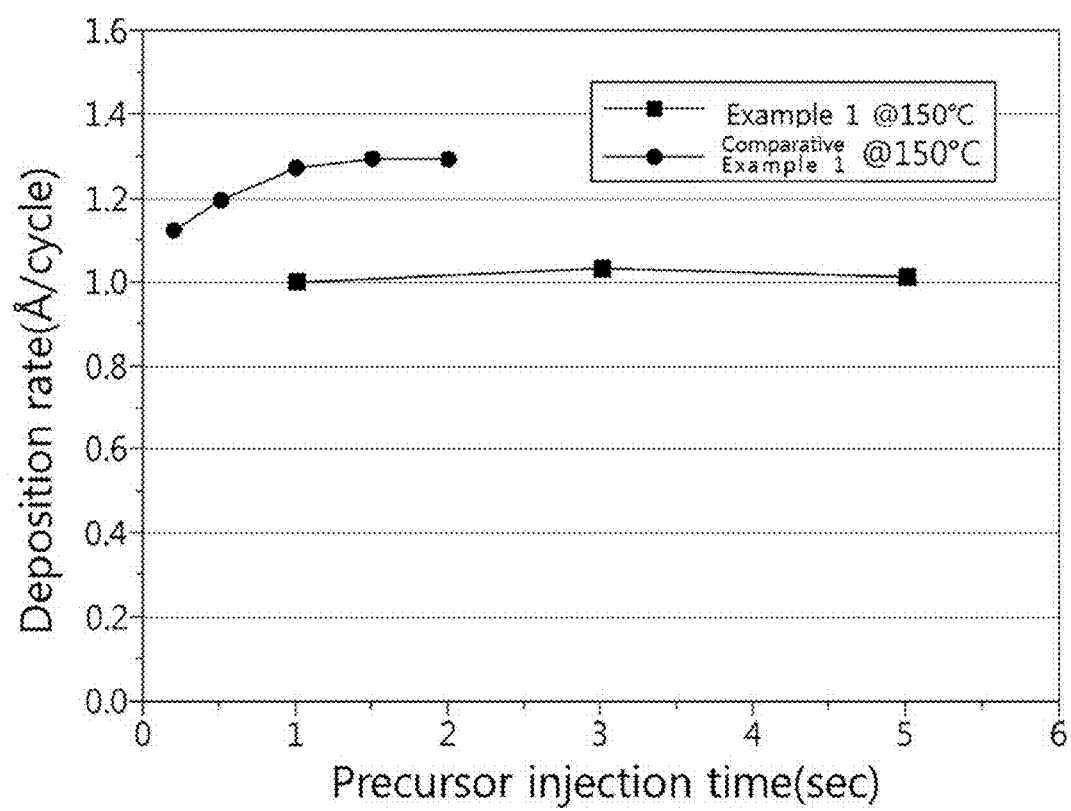
FIG. 5 is a graph showing changes in the thin film deposition rate depending on the precursor injection time in the atomic layer deposition process of the compound of Comparative Example 1 and the compound of Example 1 using water ($H_2O$) as an oxidizing agent in Preparation Example 2, in which the thin film deposition rate is uniform.

Upon atomic layer deposition (ALD) of the precursor of Example 1 $(Al(CH_3)_2[CH_3OC(CH_3)_2CH_2NtBu])$ using water ($H_2O$), the injection time of the precursor compound, exhibiting the uniform thin film deposition rate, was measured, and thus a self-limiting reaction was confirmed. As shown in FIG. 5, a uniform thin film deposition rate was obtained after an injection time of the precursor (TMA) of Comparative Example 1 of 1 sec when the processing temperature was 150° C.

TABLE 7

| Precursor | Precursor Temp. (° C.) | Carrier Gas Injection Amount (sccm) | $H_2O$ Temp. (° C.) | Processing Temp. (° C.) | Purging Gas Injection Amount (sccm) | Precursor Injection Time (sec) | Purging Gas Injection Time (sec) | $H_2O$ Injection Time (sec) | Purging Gas Injection Time (sec) | Processes (Cycles) |
|---|---|---|---|---|---|---|---|---|---|---|
| Ex.1 | 40 | 10 | 10 | 150 | 100 | 1-5 | 20 | 1.2 | 20 | 200 |
| C.Ex.1 | 5 | 10 | 10 | 150 | 500 | 0.2-2 | 10 | 1.2 | 10 | 200 |

As is apparent from Table 7, in Example 1, the precursor (1 to 5 sec), Ar (20 sec), H₂O (1.2 sec), and Ar (20 sec) were sequentially fed, and the flow rate of argon (Ar) for purging the precursor was set to 100 sccm. The temperature of the precursor of Example 1 was 40° C., the flow rate of the carrier gas was 10 sccm, the temperature of water, serving as the oxidizing agent, was 10° C., the processing temperature was 150° C., and the number of process cycles was 200.

In Comparative Example 1, the precursor (0.2 to 2 sec), Ar (10 sec), H₂O (1.2 sec), and Ar (10 sec) were sequentially fed, and the flow rate of argon (Ar) for purging the precursor was set to 500 sccm. The temperature of the precursor of Comparative Example 1 was 5° C., the flow rate of the carrier gas was 10 sccm, the temperature of water, serving as the oxidizing agent, was 10° C., the processing temperature was 150° C., and the number of process cycles was 200.

<Changes in Thin Film Deposition Rate Depending on Processing Temperature (ALD Window)>

Figure 6:
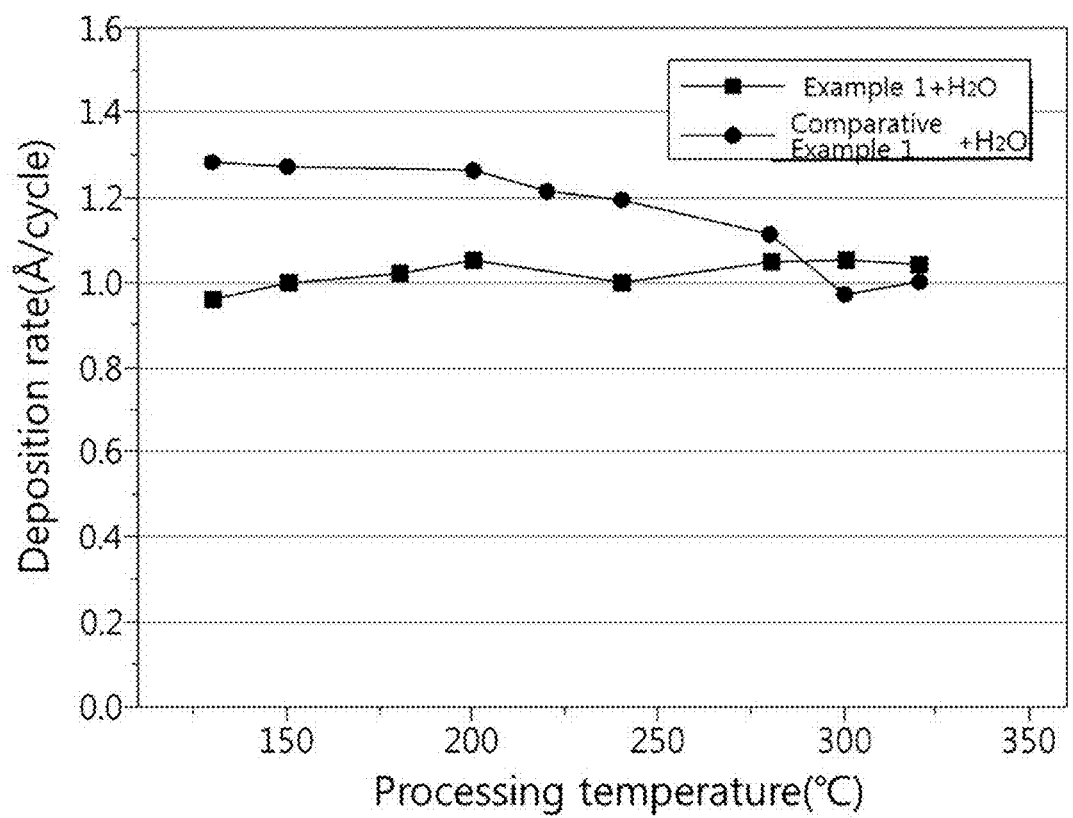
FIG. 6 is a graph showing changes in the thin film deposition rate depending on the processing temperature in the atomic layer deposition process of the compound of Comparative Example 1 and the compound of Example 1 using water ($H_2O$) as an oxidizing agent in Preparation Example 2, in which a stable thin film deposition rate depending on the processing temperature and thus a wide processing temperature range (ALD window) are exhibited in Example 1.

Upon atomic layer deposition (ALD) of the precursor of Example 1 (Al(CH₃)₂[CH₃OC(CH₃)₂CH₂NtBu]) using water (H₂O), the thin film deposition rate at different temperatures was measured and thus the processing temperature range (ALD window) was confirmed. As shown in FIG. 6, the precursor of Example 1 exhibited a uniform thin film deposition rate in the processing temperature range (ALD window) of 130° C. to 320° C. The precursor of Comparative Example 1 showed a uniform thin film deposition rate in the range of 130° C. to 200° C., but the thin film deposition rate was lowered in the range of 200° C. to 320° C. As is apparent from Table 8 below and the above description, the processing temperature range (ALD window) was wider in the precursor of Example 1 than in the precursor of Comparative Example 1.

TABLE 9

| Temperature (° C.) | Preparation Example 2 Example 1 (Al(CH₃)₂[CH₃OC(CH₃)₂CH₂NtBu]) + H₂O | | | |
|---|---|---|---|---|
| | Al (%) | O (%) | C (%) | O/Al ratio |
| 150 | 37.93 | 59.36 | 1.93 | 1.57 |
| 300 | 38.7 | 60.3 | 0.99 | 1.56 |

As is apparent from Table 9, the amounts of Al (aluminum) and O (oxygen) and the O/Al ratios were similar at temperatures of 150° C. and 300° C.

<Changes in Thickness of Thin Film Depending on Process Cycles (Growth Linearity)>

Figure 8:
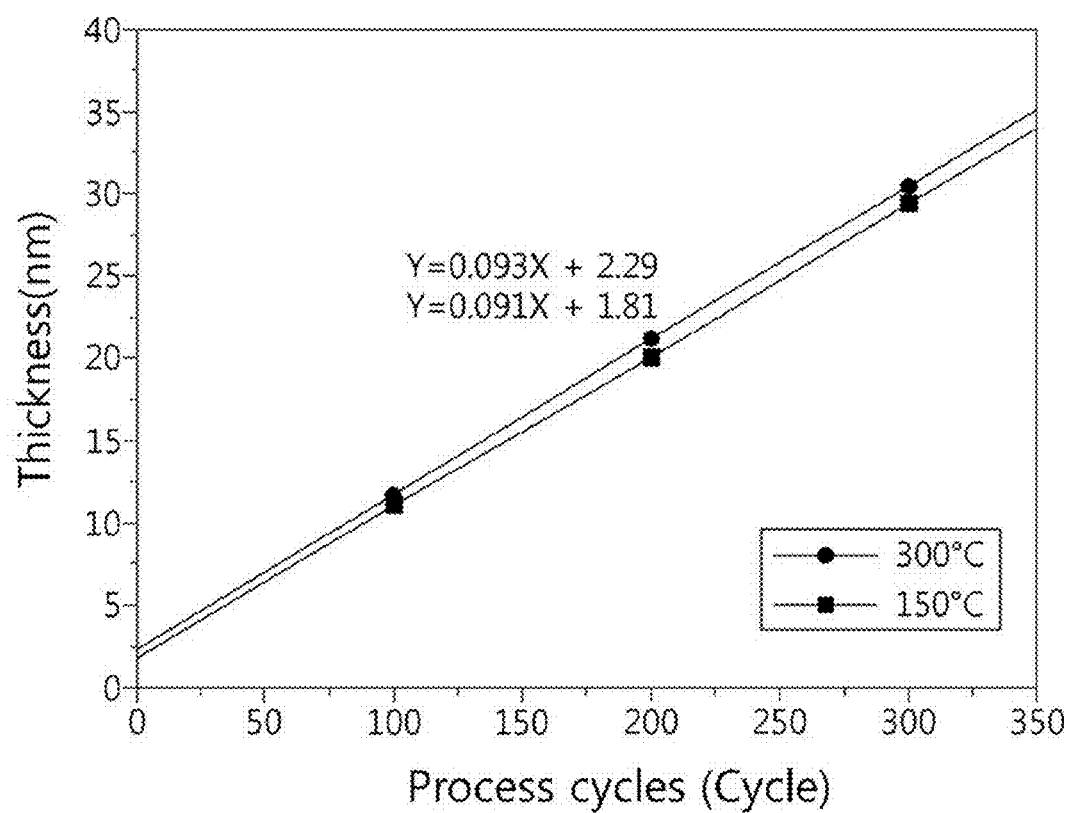
FIG. 8 is a graph showing the thickness of the $Al_2O_3$ thin film depending on the deposition cycles in the atomic layer deposition process of the compound of Example 1 using water ($H_2O$) as an oxidizing agent in Preparation Example 2.

Upon atomic layer deposition (ALD) of the precursor of Example 1 (Al(CH₃)₂[CH₃OC(CH₃)₂CH₂NtBu]) using water (H₂O), changes in the thickness of the thin film depending on the deposition cycles were similar at temperatures of 150° C. and 300° C. FIG. 8 is a graph showing changes in the thickness of the thin film depending on the process cycles, showing that the thin film deposition rate was 0.91 Å/cycle at 150° C. and 0.93 Å/cycle at 300° C.

<Density of Al₂O₃ Thin Film at Different Temperatures (Film Density by XRR)>

Figure 9:
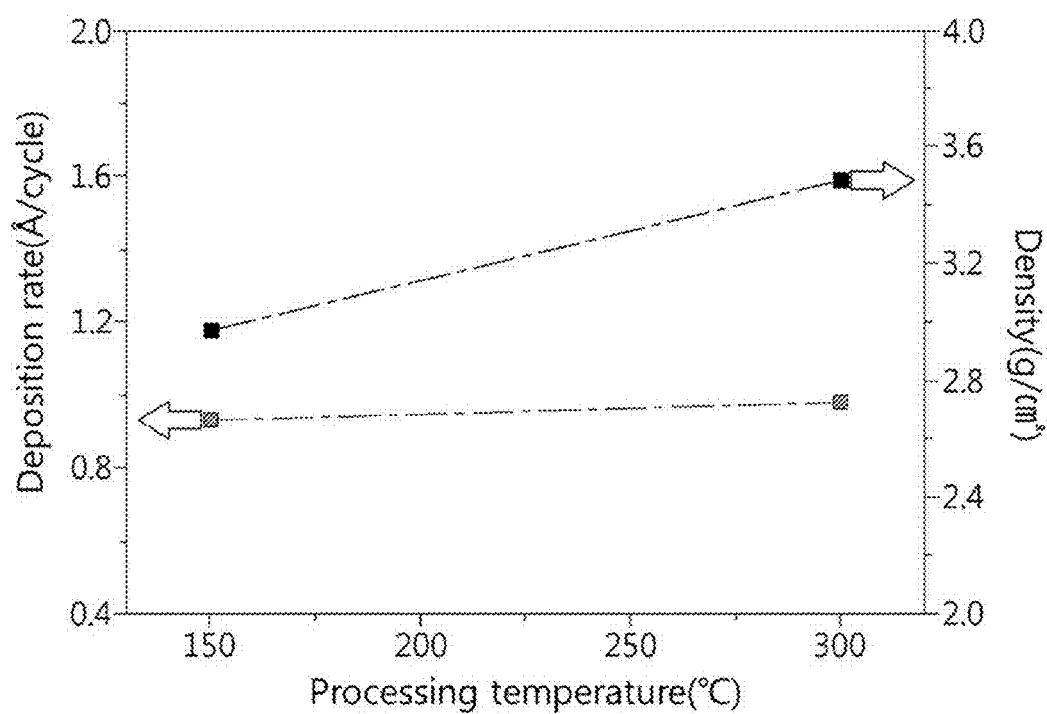
FIG. 9 is a graph showing the $Al_2O_3$ thin film deposition rate and the density depending on the temperature in the atomic layer deposition process of the compound of Example 1 using water ($H_2O$) as an oxidizing agent in Preparation Example 2.
Figure 10:
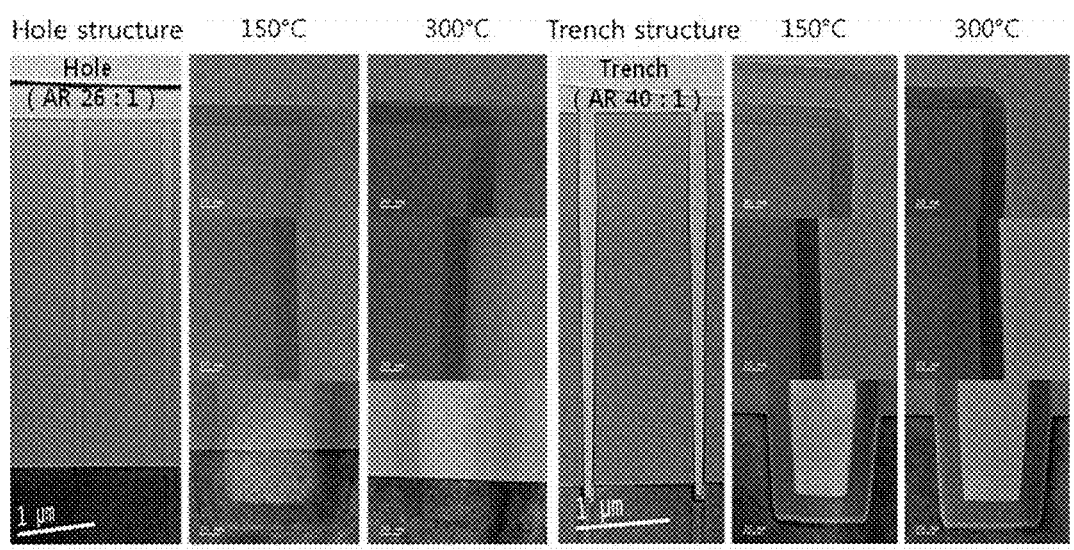
FIG. 10 is transmission electron microscopy (TEM) images showing the results of step coverage in the atomic layer deposition process of the compound of Example 1 using water ($H_2O$) as an oxidizing agent in Preparation Example 2, in which the processing temperature is 150° C. or 300° C., showing the hole structure and the trench structure, the aspect ratio (AR) of the hole structure being 26:1 and the aspect ratio of the trench structure being 40:1.

Upon atomic layer deposition (ALD) of the precursor of Example 1 (Al(CH₃)₂[CH₃OC(CH₃)₂CH₂NtBu]) using water (H₂O), the density of the thin film depending on the processing temperature was found to increase with an elevation in the temperature, and the density of the thin film was higher when using the precursor of Example 1 than when using the precursor of Comparative Example 1, which is apparent from FIG. 9 and Table 10 below. Table 10 below shows the density of Al₂O₃(Bulk) and the density depending

TABLE 8

| Precursor | Precursor Temp. (° C.) | Carrier gas injection amount (sccm) | H₂O Temp. (° C.) | Processing Temp. (° C.) | Purging gas injection amount (sccm) | Precursor Injection time (sec) | Purging gas injection time (sec) | H₂O injection time (sec) | Purging gas injection time (sec) | Processes (Cycles) |
|---|---|---|---|---|---|---|---|---|---|---|
| Ex.1 | 40 | 10 | 10 | 130-320 | 100 | 5 | 20 | 1.2 | 20 | 200 |
| C.Ex.1 | 5 | 10 | 10 | 130-320 | 500 | 1 | 10 | 1.2 | 10 | 200 |

As is apparent from Table 8 and the above description, the precursor of Example 1 had a wider processing temperature range (ALD window) than the commercially available precursor (TMA) of Comparative Example 1. Furthermore, upon measurement of the processing temperature range, in the precursor of Comparative Example 1, the amount of the purging gas that was injected was five times that of Example 1, the injection time of the precursor was one fifth as long thereof, and the injection time of the purging gas was half thereof.

<Element Content in Al₂O₃ Thin Film and O/Al Ratio>

Upon atomic layer deposition (ALD) of the precursor of Example 1 (Al(CH₃)₂[CH₃OC(CH₃)₂CH₂NtBu]) using water (H₂O), the element content (atomic %) and the element ratio (atomic ratio, O/Al) depending on the processing temperature were measured through XPS (X-ray photoelectron spectroscopy).

Figure 7:
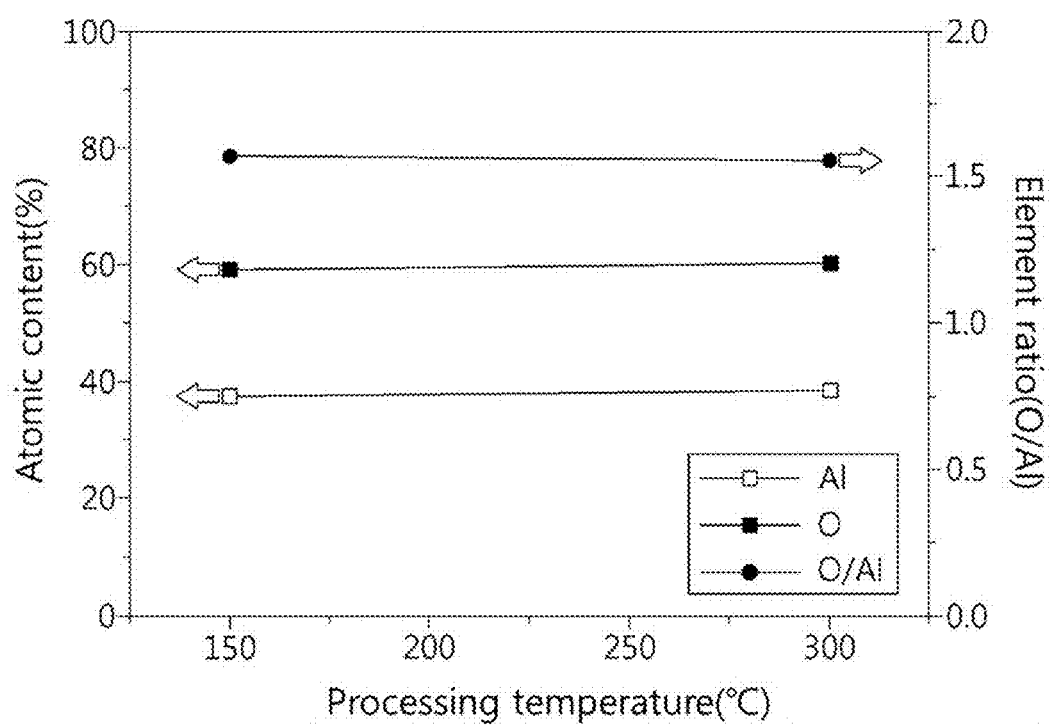
FIG. 7 is a graph showing the results of XPS of the component content of the $Al_2O_3$ thin film resulting from atomic layer deposition (ALD) of the compound of Example 1, in the atomic layer deposition process of the compound of Comparative Example 1 and the compound of Example 1 using water ($H_2O$) as an oxidizing agent in Preparation Example 2.

As seen in FIG. 7, the processing temperature fell in the range of 150° C. to 300° C., and the amount of stoichiometric Al₂O₃ thin film was determined depending on the temperature.

on the temperature upon atomic layer deposition of the precursor (TMA) of Comparative Example 1 using water (H₂O), in connection with which reference may be made to Chem. Mater. 2004, 16, 639.

TABLE 10

| Al₂O₃ | Density |
|---|---|
| Bulk | 3.70-3.80 g/cm³ |
| Example | 3.20 g/cm³ (150° C.) |
| | 3.60 g/cm³ (300° C.) |
| Comparative Example 1 | 2.46 g/cm³ (33° C.) |
| | 3.06 g/cm³ (177° C.) |

<Step Coverage of Al₂O₃ Thin Film at Different Temperatures (Step Coverage by TEM)>

Upon atomic layer deposition (ALD) of the precursor of Example 1 (Al(CH₃)₂[CH₃OC(CH₃)₂CH₂NtBu]) using water (H₂O), the step coverage of the hole and trench structures depending on the temperature was observed through TEM (Transmission Electron Microscopy). The processing temperatures were 150° C. and 300° C., and the aspect ratio (AR) was 26:1 in the hole structure and 40:1 in the trench structure.

TABLE 11

|  | Hole structure [AR 26:1] | | Trench structure [AR 40:1] | |
| --- | --- | --- | --- | --- |
|  | 150° C. | 300° C. | 150° C. | 300° C. |
| Top thickness | 21.57 nm | 21.41 nm | 20.92 nm | 22.82 nm |
| Side thickness | 22.18 nm | 22.42 nm | 21.45 nm | 22.80 nm |
| Bottom thickness | 21.13 nm | 20.89 nm | 20.64 nm | 22.50 nm |
| Bottom step coverage | 97.9% | 97.5% | 98.6% | 98.6% |
| Side step coverage | 102.8% | 104.7% | 102.5% | 99.9% |

As is apparent from Table 11, the step coverage in the hole and trench structures was 98% or more at 150° C. and 300° C. Thus, the precursor of Example 1 exhibited superior step coverage in a wide temperature range.

Although embodiments of the present invention have been described, those skilled in the art will appreciate that the present invention may be embodied in other specific forms without changing the technical spirit or essential features thereof. Thus, the embodiments described above should be understood to be non-limiting and illustrative in every way.

The scope of the present invention is represented by the following claims, rather than the detailed description, and it is to be understood that the meaning and scope of the claims and all variations or modified forms derived from equivalent concepts thereof fall within the scope of the present invention.

What is claimed is:

1. A compound represented by Chemical Formula 1 below:

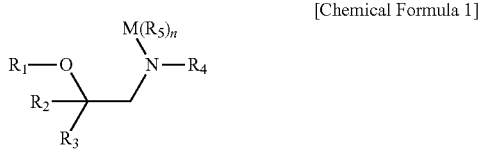

[Chemical Formula 1]

in Chemical Formula 1,
when M is a divalent transition metal of Group 12 on a periodic table, n is 1;
when M is a trivalent transition metal of Group 13 on a periodic table, n is 2;
$R_1$ to $R_3$ and $R_5$ are hydrogen, a substituted or unsubstituted C1 to C4 linear or branched alkyl group or an isomer thereof; and
$R_4$ is a tert-butyl group,
wherein the compound has an atomic layer deposition (ALD) window of 130 to 320° C.

2. The compound of claim 1, wherein the M in Chemical Formula 1 is selected from Al, Zn, In and Ga.

3. The compound of claim 1, wherein the $R_1$ to $R_3$ and $R_5$ in Chemical Formula 1 are selected from hydrogen, a methyl group, an ethyl group, an n-propyl group, an iso-propyl group, an n-butyl group, an iso-butyl group, a sec-butyl group, a tert-butyl group and an isomer thereof.

4. The compound of claim 1, wherein the $R_1$ is a methyl group;
the $R_2$ and $R_3$ are hydrogen or a methyl group; and
the $R_5$ is a methyl group or an ethyl group.

5. The compound of claim 1, wherein the Chemical Formula 1 is selected from $Al(CH_3)_2[CH_3OC(CH_3)_2CH_2NtBu]$, $Al(CH_3)_2[CH_3OCH(CH_3)CH_2NtBu]$, $Al(CH_3)_2[CH_3OCH_2CH_2NtBu]$, $Zn(CH_3)[CH_3OCH_2CH_2NtBu]$, $Zn(CH_3)[CH_3OC(CH_3)_2CH_2NtBu]$, $Zn(Et)[CH_3OC(CH_3)_2CH_2NtBu]$, $In(CH_3)_2[CH_3OCH_2CH_2NtBu]$, and $Ga(CH_3)_2[CH_3OCH_2CH_2NtBu]$ (wherein Et is ethyl, and tBu is a tert-butyl group).

6. A precursor comprising the compound of claim 1.

7. A method of manufacturing a thin film, comprising introducing a precursor comprising the compound of claim 1 into a reactor; and
injecting a reactive gas,
wherein the reactive gas is $O_3$ or $H_2O$,
wherein the method is conducted at a process temperature of 130 to 320° C., and
the method is atomic layer deposition (ALD).

* * * * *